US009240550B2

(12) United States Patent
Dellmann et al.

(10) Patent No.: US 9,240,550 B2
(45) Date of Patent: Jan. 19, 2016

(54) RESISTIVE MEMORY ELEMENT BASED ON OXYGEN-DOPED AMORPHOUS CARBON

(71) Applicant: GLOBALFOUNDRIES INC., Grand Cayman (KY)

(72) Inventors: Laurent A. Dellmann, Birmensdorf (CH); Evangelos S. Eleftheriou, Rueschlikon (CH); Chiara Marchiori, Birmensdorf (CH); Claudia Santini, Zurich (CH); Abu Sebastian, Adliswill (CH)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/333,806

(22) Filed: Jul. 17, 2014

(65) Prior Publication Data

US 2015/0036413 A1  Feb. 5, 2015

(30) Foreign Application Priority Data

Jul. 31, 2013  (GB) .................................. 1313718.7

(51) Int. Cl.
*G11C 11/00* (2006.01)
*H01L 45/00* (2006.01)
*G11C 13/00* (2006.01)

(52) U.S. Cl.
CPC .......... *H01L 45/145* (2013.01); *G11C 13/0002* (2013.01); *G11C 13/0004* (2013.01); *G11C 13/0007* (2013.01); *H01L 45/08* (2013.01); *H01L 45/1233* (2013.01); *H01L 45/1253* (2013.01); *H01L 45/149* (2013.01); *H01L 45/1625* (2013.01); *G11C 2213/35* (2013.01)

(58) Field of Classification Search
CPC .............. H01L 45/145; H01L 45/1233; H01L 45/1253; G11C 13/0004; G11C 13/0002
USPC ................................................ 365/148; 257/4
See application file for complete search history.

(56) References Cited

U.S. PATENT DOCUMENTS

| | | | |
|---|---|---|---|
| 4,939,054 A * | 7/1990 | Hotomi et al. ............... | 430/58.1 |
| 5,830,332 A | 11/1998 | Babich et al. | |
| 6,767,655 B2 * | 7/2004 | Hiramoto et al. .......... | 428/811.2 |
| 8,089,796 B2 * | 1/2012 | Tsukamoto et al. ............ | 365/63 |
| 8,129,706 B2 | 3/2012 | Ho et al. | |
| 8,148,708 B2 | 4/2012 | Hwang et al. | |
| 8,183,121 B2 * | 5/2012 | Schricker et al. ............. | 438/381 |

(Continued)

FOREIGN PATENT DOCUMENTS

WO  2010048408 A3  4/2010

OTHER PUBLICATIONS

Chai et al., "Nanoscale Bipolar and Complementary Resistive Switching Memory Based on Amorphous Carbon", IEEE Transactions on Electron Devices, vol. 58, No. 11, Nov. 2011, pp. 3933-3939.

(Continued)

*Primary Examiner* — Viet Q Nguyen
(74) *Attorney, Agent, or Firm* — Scully, Scott, Murphy & Presser, P.C.

(57) ABSTRACT

The present invention is notably directed to a resistive memory element comprising a resistively switchable material coupled to two conductive electrodes, wherein the resistively switchable material is an amorphous compound comprising carbon and oxygen. Moreover, the carbon and oxygen stoichiometric ratio can be within a range of 1:0.30 to 1:0.80.

13 Claims, 3 Drawing Sheets

(56) References Cited

U.S. PATENT DOCUMENTS

| | | | |
|---|---|---|---|
| 8,188,455 B2* | 5/2012 | Tsukamoto et al. | 257/5 |
| 8,212,231 B2* | 7/2012 | Chen | 257/4 |
| 8,334,525 B2* | 12/2012 | Nakai et al. | 257/2 |
| 8,648,323 B2* | 2/2014 | Yamamoto et al. | 257/2 |
| 2009/0011602 A1 | 1/2009 | Nozawa et al. | |
| 2010/0258526 A1 | 10/2010 | Won et al. | |
| 2010/0327253 A1* | 12/2010 | Nakai et al. | 257/4 |
| 2011/0278529 A1 | 11/2011 | Xu | |
| 2012/0001142 A1 | 1/2012 | Caimi et al. | |
| 2012/0043518 A1* | 2/2012 | Cheng et al. | 257/4 |
| 2012/0061639 A1 | 3/2012 | Yasuda | |
| 2012/0176831 A1 | 7/2012 | Xiao et al. | |
| 2013/0026435 A1 | 1/2013 | Yi et al. | |
| 2013/0121078 A1 | 5/2013 | Yan et al. | |

OTHER PUBLICATIONS

Dellmann et al., "Nonvolatile resistive memory devices based on hydrogenated amorphous carbon", IBM Research-Zurich, 8803 Ruschlikon, Switzerland, pp. 1-4.

Fu et al., "Unipolar Resistive Switching Properties of Diamondlike Carbon-Based RRAM Devices", IEEE Electron Device Letters, vol. 32, No. 6, Jun. 2011, pp. 803-805.

Lin et al., "Graphene Oxide Based Device for Flexible RRAM Application", IEEE 2nd International Symposium on Next-Generation Electronics (ISNE), Feb. 25-26, Kaohsiung, Taiwan, 2013 IEEE, pp. 396-398.

Hong et al., "Analysis on switching mechanism of graphene oxide resistive memory device", AIP, Journal of Applied Physics vol. 110, (2011).

Jeong et al., "Graphene Oxide Thin Films for Flexible Nonvolatile Memory Applications", Nano Letters, Nano Lett., 2010, vol. 10, (11), pp. 4381-4386.

Prieto et al., "Electron inelastic mean free path and dielectric properties of a-boron, a-carbon and their nitrides as determined by quantitative analysis of reflection electron energy loss spectroscopy", JVSTA, Journal of Vacuum Science and Technology A, vol. 24, (2006), pp. 396-407.

Kreupl et al., "Carbon-Based Resistive Memory", Qimonda AG, Qimonda North America, Qimonda Dresden GmbH & Co. OHG, pp. 1-4.

Santini et al., "A study of Joule heating-induced breakdown of carbon nanotube interconnects" IOP Publishing, Nanotechnology, vol. 22, (2011), pp. 1-9.

Waser et al., "Nanoionics-based resistive switching memories", Review Articles, Insight, Nature Materials, vol. 6, Nov. 2007, www.nature.com/naturematerials, 2007 Nature Publishing Group, pp. 833-840.

Sebastian et al., "Resistance switching at the nanometre scale in amorphous carbon", New Journal of Physics the open-access journal for physics, New Journal of Physics, vol. 13 (2011), IOP Publishing Ltd and Deutsche Physikalische Gesellschaft.

Kulikovsky et al., "Preparation and properties of COx films", Applied Physics A, Materials Science & Processing, Appl. Phys. A 78, pp. 393-396 (2004).

Raoux et al., "Phase-change random access memory: A scalable technology", IBM J. Res. & Dev. vol. 52 No. 4/5 Jul./Sep. 2008, 2008 IBM, pp. 465-479.

McKindra et al., "Reactive sputter-deposition of oxygenated amorphous carbon thin films in Ar/O2", Diamond & Related Materials, vol. 20 (2011), pp. 509-515, Intellectual Property Office.

Meijer, "Who Wins the Nonvolatile Memory Race?", Materials Science, pp. 1625-1626, Mar. 21, 2008, vol. 319.

Seah et al., "Quantitative Electron Spectroscopy of Surfaces: A Standard Data Base for Electron Inelastic Mean Free Paths in Solids", Surface and Interface Analysis, vol. 1, No. 1, 1979, Heyden & Son Ltd, 1979, pp. 2-11.

Tanuma et al., "Calculation of electron inelastic mean free paths (IMFPs) VII. Reliability of the TPP-2M IMFP predictive equation† ", Surface and Interface Analysis, Surf. Interface Anal. 2003; 35: 268-275, Published online in Wiley InterScience.

GB Application 1313718.7, entitled "Resistive Memory Element Based on Oxygen-Doped Amorphous Carbon", Filed on Jul. 31, 2013.

GB search report for application No. 1313718.7, search date Dec. 12, 2013.

Ielmini, "Universal Reset Characteristics of Unipolar and Bipolar Metal-Oxide RRAM", IEEE Transactions on Electron Devices, vol. 58, No. 10, Oct. 2011, pp. 3246-3253.

Choi et al., "Nanoscale Resistive Switching of a Copper-Carbon-Mixed Layer for Nonvolatile Memory Applications", IEEE Electron Device Letters, vol. 30, No. 3, Mar. 2009, pp. 302-304.

Yao et al., "Two-Terminal Nonvolatile Memories Based on Single-Walled Carbon Nanotubes", ACSNANO, www.acsnano.org, vol. 3, No. 12, pp. 4122-4126.

Zhuge et al., "Nonvolatile resistive switching memory based on amorphous carbon", Applied Physics Letters, vol. 96, 2010.

Marcano et al., "Improved Synthesis of Graphene Oxide", www.acsnano.org, vol. 4, No. 8, ACSNANO, pp. 4806-4814.

Ahn et al., "Write Current Reduction in Transition Metal Oxide Based Resistance-Change Memory", Adv. Mater. 2008, vol. 20, pp. 924-928.

* cited by examiner

RESISTIVE MEMORY ELEMENT BASED ON OXYGEN-DOPED AMORPHOUS CARBON

CROSS REFERENCE

The present application claims the benefit of priority of United Kingdom Patent Application Serial Number 1313718.7, titled "Resistive memory element based on oxygen-doped amorphous carbon", filed Jul. 31, 2013, with the United Kingdom Intellectual Property Office, the contents of which are herein incorporated by reference in its entirety.

BACKGROUND

The present invention relates in general to the field of resistive memory elements, and more particularly to resistive memory elements based on doped amorphous carbon, for example resistive random-access memory elements.

Resistive switching refers to a physical phenomenon occurring in a material that suddenly changes its resistance under action of a strong current or electric field. The change is non-volatile and reversible. Several classes of switching materials (ranging from metal oxides to chalcogenides) have been proposed in the past. The performances of these materials are appreciated mainly in terms of power consumption, integration density potential, retention, and endurance. Typical resistive switching systems are capacitor like devices, where electrodes are ordinary metals and the dielectric a resistive switching material, e.g., a transition metal oxide.

An interesting application of resistive switching is the fabrication of non-volatile resistive random-access memories (RRAM), which are promising candidates to replace conventional flash memories as they offer better scalability, higher integration density, lower cost, and lower power consumption. Recently, amorphous carbon (a-C) has been proposed as a resistive switching material for RRAM applications. Compared to oxide-based RRAM, carbon promises higher memory density and lower power consumption. The monoatomic nature of carbon would make a carbon-based memory cell scalable even to single bonds. Such cell dimensions would limit the reset current, thus reducing the power consumption. In addition, the high resilience of carbon would enable operation at high temperatures.

Another intrinsic advantage of a-C-based RRAM is the switching mechanism. Amorphous carbon is mainly formed by sp2 bonds (conductive) and sp3 bonds (insulating). When a set voltage is applied across the a-C layer, the electric field and the Joule heating induce a clustering of sp2 bonds, bringing the cell into a low resistive state. When another voltage (reset) is applied across the cell, causing a high current to flow through the sp2 filaments, these filaments break down owing to Joule heating, and the cell returns to a high resistance state. No electrochemical reaction is involved: the resistive switching in carbon is unipolar, i.e., the memory can be set and reset by means of voltages of the same polarity. In contrast, resistive switching in oxide-based RRAM occurs owing to the reduction (set) and oxidation (reset) of oxygen vacancies. Therefore, voltages of opposite polarity are needed to set and reset the cell (bipolar switching). Unipolar resistive switching, as it occurs in carbon-based RRAM, simplifies the circuit design of the memory devices, compared to bipolar switching circuits.

Another advantage of carbon-based RRAM is that no "conditioning step" is required. This step is needed in oxide-based RRAM and involves the application of a high voltage across the cell to induce a soft breakdown and form the channel in which the filaments will then grow. Because the conditioning voltage is typically much higher than the set voltage, this step might degrade the device endurance and therefore is not desirable.

To be suitable for RRAM applications, a-C needs to have the right trade-off in the content between sp2 (conductive) and sp3 (insulating) bonds. As one increases the sp3 content, the resistance of the film and the set voltage increase accordingly. This happens because the electric field that is needed to induce the clustering of sp2 bonds is higher. On the other hand, during the reset process, the sp2 filament is surrounded by a high number of sp3 bonds. This guarantees that the reset current flows only along that filament and makes it easier to break the filament down by Joule heating. In general, high resistance (high sp3 content) a-C is needed to provide reversible resistive switching.

The production of high-resistance a-C is not trivial because it requires either special deposition tools or the introduction of certain dopants in the carbon layer. Regarding the first option, it is possible to deposit tetrahedral amorphous carbon (ta-C), which presents a high sp3 content (>70%), by using deposition techniques such as filtered cathodic arc deposition (FCAD) or pulsed laser deposition (PLD).

Another way to increase the electrical resistance of a-C is to dope it with $H_2$, to form sp3 bonds with carbon. It was for instance demonstrated that the resistance of hydrogenated amorphous carbon (a-C:H) could be tuned by seven orders of magnitude by adjusting the $H_2$ content and that the resistive switching in a-C:H is reversible.

Some manufacturers have recently focused their research efforts on developing new carbon-based resistive memories. To resolve the issue of producing high-sp3-content carbon layers, they proposed different approaches, namely to:

use metal electrodes with a steering and a compressive function to increase and stabilize sp3 bonds, also compensating the $H_2$ outgassing in a-C:H;

thermally anneal the carbon layer before depositing the top electrode, eventually, under a UV lamp and in $N_2$, Ar, $H_2$, CO, $CO_2$, He or Xe;

dope carbon with one or more of: H, B, N, Si, Ti and another compound between $SiO_2$, SiON, $Si_3N_4$, $C_3N_4$, BN, AlN, $Al_2O_3$, SiC.

In other approaches, resistive switching has also been reported in graphene oxide and graphite oxide. Graphite oxide is a compound of carbon, oxygen and hydrogen, obtained by treating graphite with strong wet oxidizers. Like graphite, graphite oxide has a layered and planar structure. Each layer consists of carbon atoms arranged in a hexagonal lattice and epoxy, hydroxyl and carboxyl groups bonded to some of the carbon atoms. Graphene oxide is the monolayer form of graphite oxide and is obtained by dispersing graphite oxide in basic solutions.

SUMMARY

According to a first aspect, the present invention is embodied as a resistive memory element comprising a resistively switchable material coupled to two conductive electrodes, wherein the resistively switchable material is an amorphous compound comprising carbon and oxygen, the C:O stoichiometric ratio being a range of 1:0.30 to 1:0.80. In embodiments, the stoichiometric ratio is in a range of 1:40 to 1:0.60. Preferably, the ratio of C—C sp2 bonds to C—C sp3 bonds in the resistively switchable material in its pristine state is less than 0.4, preferably less than 0.2, more preferably less than 0.1.

In embodiments, the resistively switchable material is further doped with one or more of the following elements: Si, H and N. Preferably, a first one of the electrodes comprises a first material in contact with the resistively switchable material, the second one of the two electrodes comprises a second material in contact with the resistively switchable material, and the first material and the second material have different oxidation potentials, and wherein the first material and the second material preferably are: W and Pt, graphite or graphene and Pt, graphite or graphene and W, or W and Al, respectively. In embodiments, an average thickness of the resistively switchable material is between 2 and 30 nm, preferably between 10 and 25 nm, and more preferably between 12 and 20 nm.

Preferably, the resistively switchable material and the two conductive electrodes have a layered structure, the resistively switchable material being in a layer sandwiched between two electrode layers forming respectively the two conductive electrodes. In preferred embodiments, the resistive memory element further comprises an insulating layer, preferably comprising $SiO_2$, patterned onto one of the electrodes such as to define a cavity, the cavity filled with the resistively switchable material, and wherein the layer of resistively switchable material is preferably conformal with the insulating layer, the other one of the two electrode layers being conformal with the layer of resistively switchable material.

According to another aspect, the invention is embodied as a resistive memory element, preferably a resistive random access memory element, comprising one or more memory elements, each according to any one of the above embodiments. According to still another aspect, the invention is embodied as a method of storing information in the above resistive memory element, the method comprising: applying an electric signal, such as a voltage pulse, between the two conductive electrodes of said memory element, to change the resistance state of the memory element.

According to yet another aspect, the invention is embodied as a method of fabrication, the method comprising: obtaining a resistively switchable material that is an amorphous compound comprising carbon and oxygen, the C:O stoichiometric ratio being a range of 1:0.30 to 1:0.80, and preferably in a range of 1:0.40 to 1:0.60. In preferred embodiments, the method further comprises, prior to obtaining the resistively switchable material, the steps of: providing a substrate; and depositing a bottom electrode, preferably by sputtering. Obtaining the resistively switchable material comprises depositing said amorphous compound, preferably by sputtering, such that a region of said amorphous compound is in contact with said bottom electrode. The method further comprises, after obtaining the resistively switchable material, a step of depositing a top electrode, preferably by evaporation or sputtering.

Preferably, the method further comprises, prior to obtaining the resistively switchable material and after depositing the bottom electrode, a step of patterning an insulating layer, preferably comprising $SiO_2$, onto the bottom electrode such as to define a cavity, such that the cavity can be filled with the resistively switchable material when depositing said amorphous compound.

In embodiments, said amorphous compound is obtained by reactive sputtering. Preferably, obtaining said amorphous compound comprises: introducing a substrate comprising a conductive electrode in a sputtering chamber that comprises a graphite target; introducing in said chamber a mixture of $O_2$ gas and an inert gas such as Ar, such that the partial pressure of the $O_2$ gas is between 10 and 35% of the total pressure of the mixture; and activating a plasma state of the mixture to bombard the graphite target, such that an oxygenated amorphous carbon deposits on the conductive electrode. Devices and methods embodying the present invention will now be described, by way of non-limiting examples, and in reference to the accompanying drawings. Technical features depicted in the drawings are not to scale.

BRIEF DESCRIPTION OF SEVERAL VIEWS OF THE DRAWINGS

Novel characteristics of the invention are set forth in the appended claims. The invention will best be understood by reference to the following detailed description of the invention when read in conjunction with the accompanying figures, wherein like reference numerals indicate like components, and:

DETAILED DESCRIPTION

Figure 1:
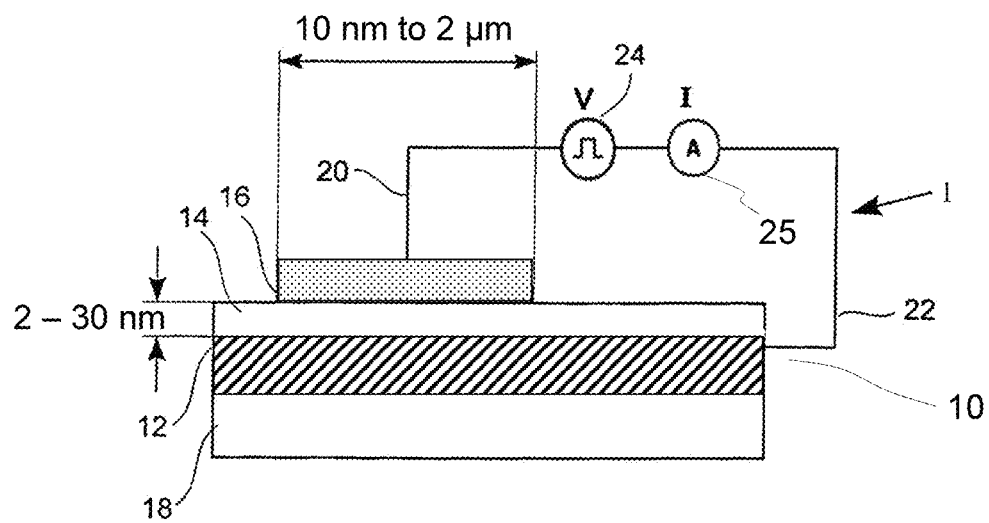
FIG. 1 is a 2D cross-sectional view of a simplified representation of a resistive memory element, comprising a resistive memory element, according to embodiments.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon. Any combination of one or more computer readable medium(s) may be utilized. The computer readable medium may be a computer readable signal medium or a computer readable storage medium.

A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing.

In the context of this document, a computer readable storage medium may be any tangible medium that can contain, or store a program for use by or in connection with an instruction execution system, apparatus, or device. A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof.

A computer readable signal medium may be any computer readable medium that is not a computer readable storage medium and that can communicate, propagate, or transport a program for use by or in connection with an instruction execution system, apparatus, or device. Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as JAVA, Smalltalk, C++ or the like, conventional procedural programming languages such as the "C" programming language, a hardware description language such as VERILOG, or similar programming languages. The program code may execute entirely on the user's computer, partly on the user's computer, as a stand-alone software package, partly on the user's computer and partly on a remote computer or entirely on the remote computer or server.

In the latter scenario, the remote computer may be connected to the user's computer through any type of network, including a local area network (LAN) or a wide area network (WAN), or the connection may be made to an external computer (for example, through the Internet using an Internet Service Provider). Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The following description is structured as follows. First, general embodiments and high-level variants are described (sect. 1). The next section addresses more specific embodiments and technical implementation details (sect. 2).

In reference to FIGS. 1 to 6, an aspect of the invention is first described, which concerns a resistive memory element 10. The terminology "memory element" is used hereafter to denote any memory device capable to be operated as a memory. It may for instance be embodied as a random-access memory element, but not necessarily. The device may comprise one or more memory cells. Some of the embodiments described below refer to a single memory cell, without prejudice. The memory element 10 depicted in the appended drawings generally comprises a resistively switchable material 14, which is coupled to two conductive electrodes 12, 16.

A remarkable feature of this memory element is that it is based on an amorphous a-C:O compound 14, a compound that comprises carbon atoms and oxygen atoms. By "amorphous", it is meant that the a-C:O compound is non-crystalline and lacks long-range order. Short-range order may exist, but with substantial deviations of the interatomic distances and/or interbonding angles with respect to crystalline forms of carbon, e.g., graphite lattice or diamond lattice (e.g., at least 5% deviation). Now, "amorphous" should be understood broadly, i.e., the a-C:O compound is essentially or, even, entirely, amorphous. It may nonetheless involve small non-amorphous regions, e.g., microcrystalline or nanocrystalline regions. Notwithstanding these small regions, the a-C:O compound considered here is a compound that remains amorphous.

Furthermore, the C:O stoichiometric ratio in the a-C:O compound must be in a range of 1:0.30 to 1:0.80, in order to observe all the advantages discussed below. How this ratio can be measured shall be discussed later, in section 2.2. The C:O stoichiometric ratios evoked herein refer to composition stoichiometry, i.e., it describes the quantitative relationships among C and O elements in the a-C:O compounds. For example, a C:O stoichiometric ratio of 1:0.30 means that there is 1 atom of carbon for 0.30 atoms of oxygen, i.e., approximately 1 atom of oxygen for 3-4 carbon atoms, on average, in the a-C:O compound. The last digit (e.g., 0 in 0.30) indicates the accuracy sought.

Using an oxygenated amorphous carbon as proposed herein offers three main advantages in terms of memory applications:
  (i) The substantial presence of oxygen in a-C:O compounds (in an amount of 1:0.30 to 1:0.80) was surprisingly found to change the intrinsic switching mechanism of amorphous carbon a-C-based resistive memories.
     In a-C-based resistive memories, set and reset usually occur only via field and Joule-heating induced clustering and breaking of graphitic chains.
     In the case of a-C:O, C—O bonds are responsible for setting and resetting the memory element via redox reactions. As such, it appears the switching mechanism becomes also chemical in the context of the invention: the presence of oxygen in the memory layer helps the reset of the memory element and the reset current is lower than in usual a-C-based memories.
  (ii) Thanks to a reduced reset current, the endurance of a-C:O memories is significantly higher than in the case of a-C resistive cells e.g., resistive RAM or RRAM. The latter only rely on a Joule heating induced reset process and do not allow for many cycles, as opposed to a-C:O memories proposed herein. On the other hand, metal oxide-based resistive cells rely mostly on a chemical effect redox reaction. Here a mixture of both mechanisms is involved, as inventors concluded.

(iii) a-C:O-based memories as discussed herein combine the advantages of a high resistive carbon layer, thanks to the reduced presence of C—C sp2 bonds, with the polarity of C—O bonds; the resulting memory element can be switched both in a unipolar way (by using voltages of same polarity) and in a bipolar way (by using voltages of opposite polarities), thus providing novel opportunities for RRAM technologies and multibit storage.

An a-C:O compound as used in present embodiments clearly differs from graphite or graphene oxide. Although graphene and graphite are carbon allotropes, which can be made insulating by doping with oxygen groups, their structure differs from that of a-C:O compounds as contemplated herein. The resistive switching of graphene or graphite oxides depends on the use of metal electrodes that can easily oxidize, such as aluminum. Once these metals are deposited on top of graphite or graphene oxide, they oxidize at the interface, and the resistive switching turns out to be the resistive switching of the oxide interface, e.g., aluminum oxide in the case of aluminum electrodes. Present inventors believe that the crystalline nature of graphite and graphene prevents these materials from exhibiting unipolar switching like amorphous carbon. Clustering of sp2 bonds (graphitic chains) across defectless graphitic plains is less favorable than in an intrinsically disordered and amorphous matrix of carbon bonds, as in amorphous carbon.

Moreover, a-C:O offers other advantages from the fabrication point of view:

a-C:O can be produced by much simpler processes e.g., reactive sputtering, than other high resistive amorphous carbon layers, such as tetrahedral a-C or, also, other C—O compounds, such as graphene oxide and graphite oxide, which have been proposed for RRAM applications; and The electrical resistance of a-C:O layers and, consequently, the power consumption of the memory can be easily tuned by changing the C:O ratio in the compound.

As discussed in details below, the present invention can further be embodied as a resistive memory element 1, e.g., a RRAM element, such as depicted in FIG. 1. This resistive memory element 1 shall comprise at least one, typically several memory elements 10, suitably connected in a memory circuit, as otherwise known per se independently from the novel aspects of the embodiments disclosed here. The invention may further be embodied as methods for storing information in such a resistive memory element 1. As otherwise known in the field of resistive memory elements, storing information can be achieved by applying an electric signal, such as a voltage pulse 24, between the two conductive electrodes 12, 16, in order to change the resistance state of the memory element 10. Many memory element configurations (including electrode configuration) and programming methods are known in the field of resistively switchable materials, which may be applied to present devices, as the skilled reader may appreciate. Still, it should be borne in mind that a-C:O materials as relied upon here can be switched both in unipolar and in bipolar ways. Finally, the invention can also be embodied as methods of fabrication of such a resistive memory element, see FIG. 4, which methods primarily revolve around obtaining a suitable a-C:O compound, coupled to electrodes.

Referring to FIG. 1, the thickness of the resistive layer 14 typically is between 4 and 30 nm, inasmuch as sputtering e.g., DC plasma sputtering is used for fabrication. Thicknesses of 17±3 nm were for instance tested, yielding most satisfactory results. Yet, thinner layers could be contemplated using other fabrication processes, e.g., Atomic Layer Deposition or ALD, e.g., down to 2 nm. A characteristic lateral dimension of an electrode 12, 16 or active/switching region 14 in a test device is on the order of 1 to 2 μm. Note that the bottom electrode 12 is not necessary larger than the top electrode in a sandwich structure, contrary to what FIG. 1 may suggest. The bottom and top electrodes have typically the same size. Still they may cross each other and, depending on where the cross section is taken, it may look like one of the electrodes is larger. This is however not relevant to the present invention. Lateral dimensions may vary, depending on the actual implementation sought and feasibility. Ideally it is as small as possible in the final product, e.g., 10 nm (or even smaller, depending on the technology used).

The oxygen distribution concentration profile in layer 14 typically is homogeneous, at least when the device is in its pristine state. Because electrical fields are applied in operation, oxygen atoms may migrate. As a result, the resistive layer may have a more or less uniform distribution of carbon and oxygen atoms upon cycling. Furthermore, solid state reactions may occur between the oxygenated amorphous carbon and the metal electrodes, as an effect of the Joule heating involved during the memory element operation. Eventually, oxygen migration and Joule heating effects may lead to the formation of interfaces with one or both metal electrodes, e.g., an oxide at an interface, and a carbide at the other interface, and/or they may induce phase changes and clustering effects within the oxygenated carbon layer, e.g., they could induce the formation of C—C sp2 clusters or of a more graphitic layer upon cycling.

The resistive layer 14 can be regarded as an amorphous carbon oxide, which comprises C—O bonds such as, but not limited to, carbonyl, ether and ester groups. Such bonds are believed to be intimately linked to the resistive switching process observed here. The device 1 depicted in FIG. 1 has a region 14 between electrodes 12, 16 with a switchable resistance. The resistance in this region 14 is reversibly switchable between different states, e.g., by applying different voltage pulses e.g. 20, 22 and 24 by a pulse generator. The application of voltage pulses 24 leads to different resistance states of the layer 14. By measuring the current 25, which flows through the layer 14, the different resistance states can be read.

The switching mechanism is otherwise comparable to what occurs in e.g., metal oxides, inasmuch as it involves oxygen vacancies in the set process as well as other effects of the oxygen ions in the reset process. However, it differs in that as it also involves Joule heating in the reset process. The resistive layer can furthermore be programmed in order to provide different resistance states upon application of an electric signal between the two conductive electrodes, the resistance state of the resistive compound embodying information stored in the memory element. Improved performances were observed in terms of endurance and power consumption for C:O stoichiometric ratios in the range of 1:0.40 to 1:0.60.

C—C sp3 bonds play an important role: they are manifestly responsible for the resistivity of the compound as opposed to C—C sp2 bond. Increasing resistivity is desired inasmuch as it enables better high-to-low resistance ratios. On the other hand, this requires higher operating voltage and in turn larger power consumption. Inventors found it generally satisfactory to have a ratio of C—C sp2 bonds to C—C sp3 bonds in the a-C:O compound that, in its pristine state, is less than 0.4. However, they observed better performances with lower ratios, i.e., less than 0.2 or, even, less than 0.1. In some of the devices tested, the C—C sp2 bonds were not even detectable (e.g., by X-ray photoelectron spectroscopy). The above ratios can be achieved using fabrication methods as described below.

Note that the resistive layer 14 may further contain small amounts of graphitic carbon allotropes, i.e., fullerenes, carbon nanotubes, graphitic clusters, etc., which implies the presence of C—C sp2 bonds. This can advantageously be used to tune power consumption vs. resistivity. In addition, graphitic carbon allotropes may help to improve chemical stability of the layer. Notwithstanding the possible presence of graphitic carbon allotropes, the resistively switchable material 14 is essentially amorphous. In addition, the resistively switchable material 14 may be doped, e.g., with one or more of Si, H and N, a thing that proves useful to improve chemical stability and reduce variability between memory elements, as well as to further improve retention and endurance of the memory elements.

In embodiments, the electrodes 12, 16 comprise different materials. Namely, one 12 of the electrodes may comprise a first material (in contact with the switchable material 14), while the second electrode 16 comprises a second material (in contact with the switchable material 14 too), distinct from the first material. The first and second materials have, preferably, different oxidation potentials. These materials can for instance be (respectively): tungsten and platinum, graphite or graphene and Pt, graphite or graphene and tungsten, or tungsten and aluminum. Thus, electrodes preferably comprise metals (they may also comprise highly-doped semiconductors), or may comprise graphite or graphene. Having two electrodes with different oxidation potentials contributes to reduce the power consumption when switching the memory in a bipolar way. The reducing electrode helps to reduce oxygen vacancies C dangling bonds, the oxidizing electrode helps to trap O ions, as needed when setting the memory element. At the reset, oxygen is released by the oxidizing electrode and oxidizes carbon filaments responsible for the set. Switching in a bipolar way may be preferred as it requires less power during cycling, i.e., after forming. The alternative use of unipolar and bipolar switching may further be advantageous for multibit storage.

Figures 2, 3:
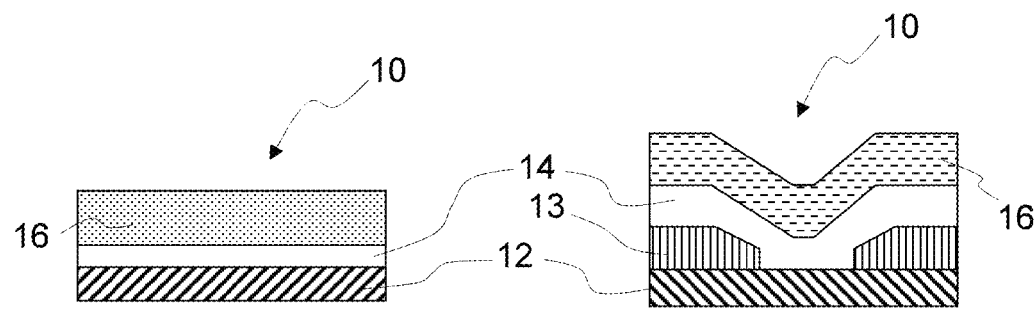
FIG. 2 is a 2D cross-sectional view of a simplified representation of a memory element such as depicted in FIG. 1, according to embodiments.
FIG. 3 is a variant to FIG. 2, wherein the memory element further comprises an insulating layer such as $SiO_2$, patterned onto the bottom electrode such as to define a cavity, which cavity is filled with a resistively switchable material, according to embodiments.

As shown in FIGS. 1-3, the resistively switchable material 14 and the two conductive electrodes 12, 16 typically have a layered structure, the resistively switchable material 14 being in a layer sandwiched between two electrode layers forming respectively the two conductive electrodes 12, 16. The average thickness of the resistively switchable material is typically between 2 and 30 nm. With ALD, uniform thicknesses as small as 2 nm could be achieved, whereas thickness uniformity is generally more challenging to achieve by reactive sputtering. Too thin layers may result in too high variability, while too thick layers may require higher voltage power. As present inventors have concluded, a satisfactory trade-off is an average thickness of the resistively switchable material that is between 10 and 25 nm. However, better results in terms of stability and power consumption were obtained with thicknesses between 12 and 20 nm. Lateral dimensions are determined by the fabrication technology. Ideally, they are as small as possible. In a test device, the memory element lateral dimension was on the order of 1 to 2 μm. In a RRAM device, lateral dimensions would be as small as possible, e.g., 10 nm.

Figure 6:
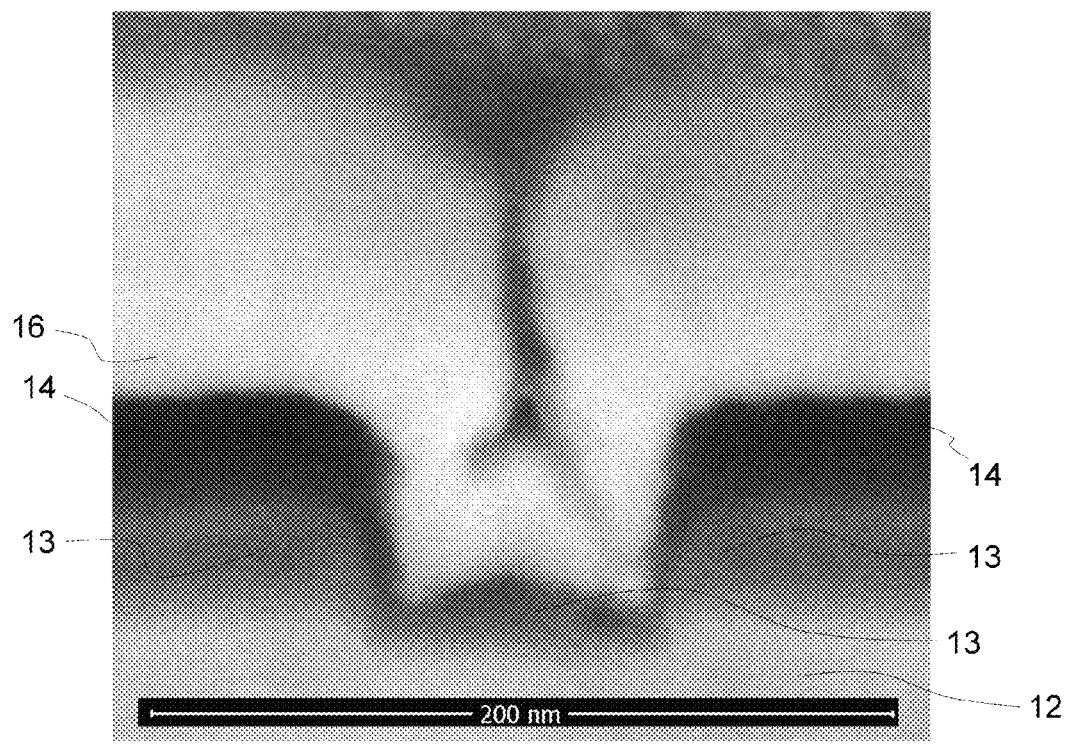
FIG. 6 is a scanning electron microscope image of a confined structure such as depicted in FIG. 3, according to embodiments.

Referring now more specifically to FIGS. 3 and 6: in embodiments, a resistive memory element may further comprise an insulating layer 13, e.g., comprising $SiO_2$. The insulating layer 13 is patterned onto one of the electrodes 12, 16, e.g., the bottom electrode 12, such as to define a cavity, i.e., an opening. This cavity is filled with the switchable material 14, which may otherwise be conformal with the insulating layer 13 (the electrode layer 16 being conformal with the layer 14). Such a configuration allows for reducing the cell size, i.e., where switching takes place. This is advantageous as one ideally wants to make the cell as small as possible, be it to gain space and increase the density of the memories. A further advantage of the confining cavity is that it leads to better confine the heat, in operation. Since the Joule heating effect is also responsible for the switching of the cell, a better heat confinement allows for lower power consumption. That is, essentially all heat produced remains in the cell, which heat is otherwise used to switch the cell. Another advantage is that the physical confinement also better protect the layer 14 and prevent contamination from the environment e.g., humidity.

Figure 4:
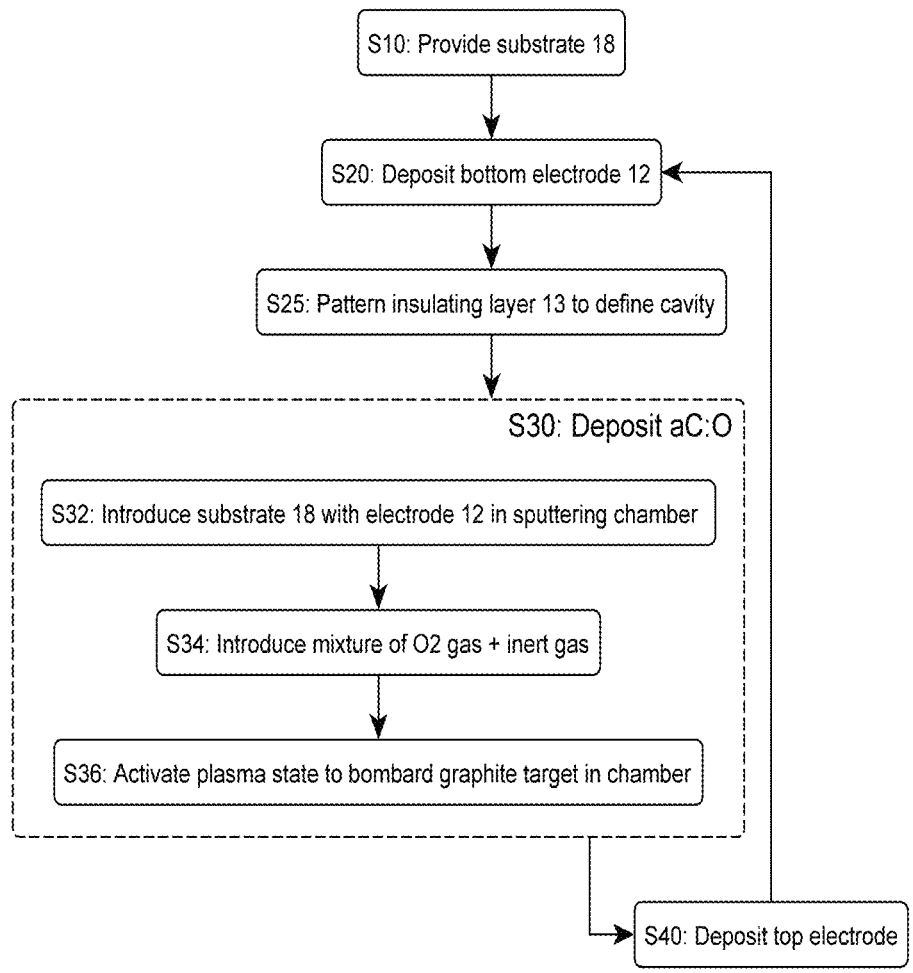
FIG. 4 is a flowchart illustrating high-level steps of a fabrication method of a device according to embodiments.
Figure 5:
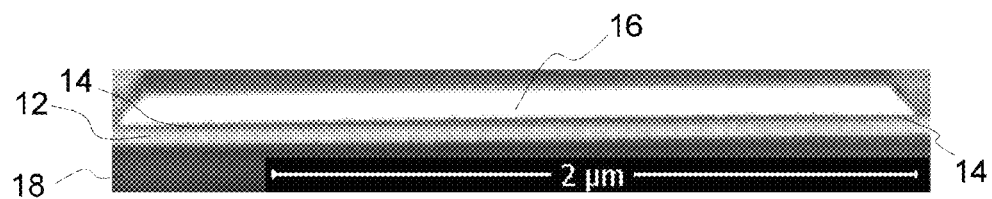
FIG. 5 is a scanning electron microscope image of layered structure of a memory element such as depicted in FIG. 2, according to embodiments.

At present, more is said about the fabrication methods. FIG. 4 shows a high-level flowchart of fabrication steps. An essential point is to obtain a suitable a-C:O compound, step S30, having the required properties, as described above. But prior to fabricating the resistively switchable material 14, a fabrication method shall typically comprise steps of: providing S10 a substrate 18 (that may for instance comprise Si, $SiO_2$, etc.); and depositing S20 a bottom electrode 12, e.g., by sputtering. Next, at step S30, the a-C:O compound is obtained (preferably by sputtering). Step S30 is carried out such that a region of the a-C:O compound is in contact with the bottom electrode 12, as otherwise depicted in FIGS. 1-3, 5 and 6. The fabrication of the memory element can be completed by depositing S40 a top electrode 16, preferably by evaporation or sputtering, on top of (part of) the a-C:O layer.

As evoked above, a cavity (as depicted in FIG. 3 or 6) can be obtained by patterning S25 an insulating layer 13 (e.g., $SiO_2$) onto the bottom electrode 12, i.e., such as to draw an opening. In this respect, various lithographic steps may be involved, be it to create this cavity, step S25. In addition, various common steps may be needed, e.g., cleaning steps after step S20 to remove a native oxide, etc. In variants to vertical processes, horizontal fabrication processes can be contemplated too, though generally less practical from a fabrication point of view, as well as in terms of density.

Of particular advantage is to use reactive sputtering to obtain the amorphous compound. For example, step S30 may decompose into three main steps, which are:

Step S32: the substrate 18, comprising a conductive electrode 12 thereon, may be introduced in a sputtering chamber. The chamber comprises a graphite target;

Step S34: one introduces in said chamber a mixture of $O_2$ gas and an inert gas such as Ar. As present inventors discovered, one possible way for obtaining a C:O stoichiometric ratio in the desired range (1:0.30 to 1:0.80) is to reach a partial pressure of $O_2$ that is between 10 and 35% of the total pressure of the mixture, while introducing it in the chamber. For a mixture of gases (assuming an ideal mixture is introduced), the contribution to the total pressure p by a constituent is called the partial pressure $p_i = x_i p$ of that constituent, where $x_i$ is the amount fraction (or mole fraction) of the ith constituent. Thus, one understands that the above values (10 to 35%) correspond to an actual mole percentage (or "amount" percent) of $O_2$, with respect to the total number of moles of the mixture (that is, the amount fraction expressed in percents, where a percent is one part in a hundred, i.e., %=0.01). Equivalently, assuming ideal mixtures, the above values (10 to 35%) correspond to the volume fraction of $O_2$, and even to the volume flow rate fraction of $O_2$ in the mixture introduced in the chamber. In the following, one refers to the $O_2$ partial pressure, expressed in %, for simplicity.

Step S36: a plasma state of the mixture (of $O_2$ and Ar) is activated. Activation of the plasma state needs activation of an energy source e.g., DC or RF, as known per se in reactive sputtering. The ions present in the plasma will physically and chemically react with the graphite target, such that an oxygenated amorphous carbon 14 eventually deposits on the conductive electrode 12.

In variants, any suitable non-reactive gas could be used instead of an inert gas. Still other gases could be used, which may form other bonds during the process. For example, one may introduce $N_2$, $H_2$, $SiH_4$ or $CH_4$ or other C—H gases but this may result in forming other C—H or C—Si or C—N bonds as well, which might be advantageous to improve chemical stability, retention and endurance of the memory. The specific method described above (reactive sputtering) allows for fine tuning the C:O stoichiometric ratio as well as the ratio of C—C sp2 bonds to C—C sp3 bonds. The key point is the partial pressure of the $O_2$ gas, which must be maintained between 10 and 35% when introducing $O_2$ in the chamber. Some trial-and-error optimization may be useful: change the partial pressure of $O_2$, measure the C:O and/or the Sp3-to-Sp2 bond ratio (e.g., by X-ray photoelectron spectroscopy), then change the partial pressure of $O_2$ again, etc. The above embodiments have been succinctly described in reference to the accompanying drawings and may accommodate a number of variants. Several combinations of the above features may be contemplated. Examples are given in the next section.

According to embodiments of the present invention, a-C:O is preferably produced by magnetron sputtering of a graphite target in an $O_2$+Ar forming gas, as explained above. Still, another means to include oxygen in the carbon layer is to anneal amorphous carbon in $O_2$, $O_3$ or any other oxidant gas. X-ray photoelectron spectroscopy (XPS) investigations show that C—O bonds are formed in an a-C layer when the latter is annealed for 15 min under a UV lamp, i.e., in $O_3$. However, an annealing step creates C—O bonds essentially on the a-C top surface, thus this might still produce layers having too low resistance, unless a-C is already doped with other elements, e.g., with $H_2$. In comparison, sputtering graphite in an $O_2$-rich environment produces C—O bonds well-distributed across the entire carbon layer. Contrary to graphene oxide and graphite oxide, a-C:O has no major structural order or crystalline phases. Instead, sp3, sp2 and sp carbon bonds as well as different C—O bonds will form in a disordered matrix. Compared with graphite/graphene oxide, a-C:O may be obtained with easier fabrication processes and its electrical resistance can easily be tuned by changing the oxygen amount.

Every characterization method has its advantages and drawbacks. In the following, a detailed X-ray photoelectron spectroscopy (XPS) method is discussed. This method was specifically adapted to the present context: it allows for very accurately measuring the quantities of O and C elements in samples containing these two elements only, for determining the C:O stoichiometry resulting from fabrication methods described earlier. It is noted, however, that other well-known characterization methods could be used to obtain the desired C:O stoichiometry with a similar precision. In addition, the fabrication process used may already make it possible to estimate the final stoichiometry. Thus, present inventors believe that the claimed C:O stoichiometry values do not critically depend on the method used to measure/calculate it XPS measurements are performed using a monochromatic Al Kα x-ray source (λ=1486.74 eV) and a Phoibos 150 hemispherical analyzer. The photo-emitted electron detection angle θ, defined with respect to the sample normal, is 50, while the radiation-source to detector angle γ is 68.3. The zero of the energy axis is calibrated on clean silver and gold reference samples, with Ag3d5/2 at 368.23 eV, $Au4f_{7/2}$ at 84.00 eV and the metals Fermi edge at 0.00 eV. The transmission function of the system, T (E), is determined on clean Au and Ag samples as discussed below.

On each sample, a full survey spectrum covering the 0 to 1400 eV binding energy range is first acquired, to check that no elements other than C and O are present in the layers (at least not above the detection limit of the system). Indeed, the set of peaks detected allows us to conclude unambiguously that the samples consist of C and O only (the presence of H cannot be ruled out since this element cannot be detected by XPS). Then, the specific C1s and O1s core level spectra are acquired in fixed analyzer transmission mode with 10 eV pass energy and 0.05 eV energy step. The C1s peaks are located in the 285 to 291 eV binding energy range and the O1s peaks in the 528 to 538 eV range, as widely reported in the literature for these elements.

In order to quantify the amount of O and C, the peak area of the C1s and O1s is determined by simply integrating the peaks over their Shirley background lines. This does not imply any a priori model of the type of bonds contained in the layers. The integrated areas of the specific C1s and O1s peaks after background subtraction can be expressed as:

$$I(C1s) = J\sigma_{C1s} L_{C1s} n_{C1s} \lambda_{C1s} \cos\theta T(E_{C1s}) \qquad (1)$$

$$I(O1s) = J\sigma_{O1s} L_{O1s} n_{O1s} \lambda_{O1s} \cos\theta T(E_{O1s}) \qquad (2)$$

Where J is the x-ray line flux intensity, σ is the photoelectron cross section, L the angular asymmetry of the photoemission intensity for each atom, n the atomic density of the specific element in the matrix, λ the inelastic mean free path and T(E) the transmission function of the analyzer. Clearly J and T(E) are determined by the specific spectrometer used, while σ, L, n and λ are materials dependent.

In order to extract "universal" C:O values from the XPS ratios, these ratios need first to be corrected by the instrument-dependent parameters. The x-ray flux intensity J cancels out since a ratio between peak areas (ratios between Equations 1 and 2) is considered and J is common to the two of them. T(E) is determined by the efficiency with which the photo emitted electrons are sampled by the spectrometer and strongly depends on the kinetic energy of the electrons, which is different for the C1s and the O1s peak. T(E) depends also on the operating mode of the lens system and of the hemispherical analyzer. Therefore, the T(E) of the specific XPS tool, which is used in our experiments, is first carefully determined on clean gold and silver reference samples for the same pass energy and lens settings used to analyze the C:O samples. The C/O peak area ratios are afterwards corrected for the obtained T(E) values.

Then the C/O peak area ratios are normalized by the remaining materials parameters. We assign to $\sigma_{C1s}$ and $\sigma_{O1s}$ the Scofield's tabulated values of $1.36 \cdot 10^{-4}$ Å$^2$ and $3.985 \cdot 10^{-4}$ Å$^2$, respectively. In order to double check our assumptions, also the Yeh and Lindau tabulated values are assigned to $\sigma_{C1s}$ and $\sigma_{O1s}$ and this leads to the same $\sigma_{C1s}/\sigma_{O1s}$ ratio. $L_{C1s}$ and $L_{O1s}$ cancel out since the C1s and O1s orbitals have the same anisotropy value of 2. The last parameter to be defined is λ, which is more difficult to quantify since it depends on specific parameters of the material (density, band gap and valence electrons), and they are unknown. We have therefore used different λ values (hereafter $\lambda_1$, $\lambda_2$ and $\lambda_3$), which values are assumed to define the range in which the real value should be. The values (in Angstrom) of $\lambda_1$, $\lambda_2$ and $\lambda_3$ for O1s and C1s are reported in table I below, in addition to the various O/C values as obtained at different stages (after successive correction steps).

$\lambda_1$ is derived from Sessa, a software for the simulation of electron spectra. The software defines the density and the number of valence electrons from the molecular formula provided as input and uses these numbers to calculate $\lambda$ with the TPP-2M predictive formula [Tanuma S, Powell C J and Penn D R 2003 *Surfaces and Interfaces Analysis* 35 268-275]. $\lambda_2$ is calculated using an empirical formula which was suggested by Seah and Dench in [Surface and Interface Analysis 1, pg 1 (1979)], $\lambda = A*KE^{-2} + B*KE^{0.5}$ with A=1.7 and B=0.096 for inorganic compounds. Finally, $\lambda_3$ is the inelastic mean free path for photo emitted electrons in amorphous C as measured and reported in [J. Vac. Sci. Technol. A 24, 396 (2006)].

TABLE I

O/C values as obtained at different stages of the determination method and for the different values of $\lambda$ used

| O/C values at various stages | O2 partial pressure | | | | | |
|---|---|---|---|---|---|---|
| | 10% | 15% | 20% | 25% | 30% | 35% |
| As measured | 0.91 | 1.07 | 1.23 | 1.37 | 1.51 | 1.65 |
| Normalized by T(E) | 0.96 | 1.12 | 1.29 | 1.43 | 1.58 | 1.73 |
| Normalized by T(E), σ | 0.33 | 0.38 | 0.44 | 0.49 | 0.54 | 0.59 |
| $\lambda_1$ for O1s electrons | 25.43 | 25.39 | 25.71 | 25.67 | 25.63 | 25.60 |
| $\lambda_1$ for C1s electrons | 30.85 | 30.81 | 30.18 | 31.13 | 31.083 | 31.04 |
| Normalized by T(E), σ, $\lambda_1$ | 0.40 | 0.46 | 0.52 | 0.59 | 0.66 | 0.72 |
| $\lambda_2$ for O1s electrons | 29.68 | 29.68 | 29.68 | 29.68 | 29.68 | 29.68 |
| $\lambda_2$ for C1s electrons | 33.26 | 33.26 | 33.26 | 33.26 | 33.26 | 33.26 |
| Normalized by T(E), σ, $\lambda_2$ | 0.36 | 0.43 | 0.49 | 0.55 | 0.61 | 0.66 |
| $\lambda_3$ for O1s electrons | 25.95 | 25.95 | 25.95 | 25.95 | 25.95 | 25.95 |
| $\lambda_3$ for C1s electrons | 31.09 | 31.09 | 31.09 | 31.09 | 31.09 | 31.09 |
| Normalized by T(E), σ, $\lambda_3$ | 0.39 | 0.46 | 0.53 | 0.59 | 0.65 | 0.71 |

The layers grown with 10% to 35% $O_2$ "partial pressure" show resistive switching, therefore the C:O stoichiometry values for the claimed resistive memory elements are between 1:0.36 and 1:0.72, as derived from the table. Adding an additional tolerance estimated after the whole quantification procedure, the C:O range that we consider is advantageous for resistive memory applications is C:O comprised between 1:0.30 and 1:0.80. Since the best memory performance in terms of stability and power consumption are obtained when the oxygen partial pressure is between 15% and 20%, the preferred range of stoichiometric ratios for the discussed resistive memories is C:O=1:0.40 to C:O=1:0.60.

The procedure described above to determine the C:O ratio is valid for layers which are homogeneous in composition. We have notably measured 4, 6 and 18 nm thick layers grown with 25% $O_2$ partial pressure in the forming gas and we have observed that the C1s peak shape does not change with sample thickness, nor does the C/O ratio. This demonstrates that the sample composition is homogeneous through the whole thickness, at least when the memory is in its pristine state.

Finally by fitting the C1s spectra, we can define which types of C—O bonds are contained in the layers. We use the minimum number of peaks required. For samples grown with more than 25% $O_2$, we find that only one carbon peak corresponding to Csp3 and three oxidized components are necessary for obtaining a good fit. For samples grown with less than 20% $O_2$ partial pressure, an additional carbon peak corresponding to Csp2 is needed (shifted at lower binding and with the shape of a Csp2 as derived from a graphite reference sample). The first oxidized component is shifted by +1.6 eV with respect to the Csp3. Due to its large full width at half maximum, this peak may be the convolution of a peak related to ether C—O—C and alcohol C—OH bonds (+1.2 to 1.7 eV shift in literature) and to a second peak related to carbonyl C═O bonds (+2.5 to 2.7 eV shift in literature). The second oxidized spectral component located at +3.8 eV with respect to Csp3 is attributed to ester and acid O—C═O bonds (+4.0 to 4.5 shift in literature). Finally a third component is required at +6.6 eV, although extremely faint. Assuming that the C—O bonds are homogeneously distributed into the Csp3 matrix, the ratio between the XPS CO and the Csp3 peak areas should be proportional to the amount of oxidized C species. Indeed, these peak area ratios increase with the amount of $O_2$ provided during growth, as shown below. This demonstrates that O is incorporated into the layers bonding to C.

When the $O_2$ partial pressure is increased from 10% to 35% of the total pressure during sputtering, the resistivity of the a-C:O layers (as measured at 0.2 V) increases from 5 m to $10^6$ m (measured for 15 nm thick layers and a cell size of $1 \times 1$ m$^2$). In order to set the cell, which is initially in high resistance state, a voltage pulse needs to be applied, which will induce the formation of conductive filaments within the a-C:O layer, bringing the cell into a low resistance state. At this step it desired to limit the current that flows across the cell, e.g., by using a series resistor, in order to avoid that the cell is overheated while setting it.

Next, in order to reset the cell, bringing it back to a high resistance state, significant heating is required to disrupt the conductive filaments. Hence, a larger current needs to be passed through the cell, as compared to the set process, and no current limiter needs to be used. This first memory cycle requires higher power consumption than the following cycles, thus, it can be considered as a forming step. a-C:O cells can be switched either by applying voltage pulses of the same polarity (unipolar switching) or by applying voltage pulses of opposite polarities (bipolar switching). The corresponding $R_{OFF}/R_{ON}$ ratio is $10^3$ or higher. The endurance of the cell is higher than $10^4$ cycles and the retention of the resistance states longer than $10^4$ s.

Further investigations on the underlying phenomena led to the following conclusions: The presence of C—O bonds that form in a-C:O layers is believed to play an important role in the resistive switching of the present memory elements. C—O bonds have a strong polarity as the difference in electronegativity between C and O is high (2.5 for C and 3.5 for O). When a set voltage pulse is applied across the a-C:O layer, the C—O bonds dissociate. The oxygen anions will oxidize the more oxidant metal electrode, e.g., W, while the carbon cations will be reduced at the more reducing metal electrode, e.g., Pt, forming the conductive filaments across the cell, which are responsible for the low resistance state. Next, when a reset voltage pulse is applied across the a-C:O layer, now in low resistance state, oxygen is released from the metal electrodes and contributes to disrupt the conductive filaments, bringing the cell back into a high resistance state. The Joule heat produced along the conductive filament together with the oxidation effect of the oxygen anions promotes the reset of the conductive filaments.

While the present invention has been described with reference to a limited number of embodiments, variants and the accompanying drawings, it will be understood by those skilled in the art that various changes may be made and equivalents may be substituted without departing from the scope of the present invention. In particular, a feature (device-like or method-like) recited in a given embodiment, variant or shown in a drawing may be combined with or replace another feature in another embodiment, variant or drawing, without departing from the scope of the present invention. Various combinations of the features described in respect of any of the above embodiments or variants may accordingly be contemplated, that remain within the scope of the appended claims. In addition, many minor modifications may be made to adapt a particular situation or material to the teachings of the present invention without departing from its scope. Therefore, it is intended that the present invention is not limited to the particular embodiments disclosed, but that the present invention will include all embodiments falling within the scope of the appended claims. In addition, many other variants than explicitly touched above can be contemplated. For example, other materials could be used for the electrodes and additional, intermediate layers may provide additional advantages. Various electrode arrangements can be contemplated, beyond the classic two-terminal configurations depicted here.

What is claimed is:

1. A resistive memory element comprising:
a resistively switchable material coupled to two conductive electrodes, wherein the resistively switchable material is an amorphous compound comprising carbon and oxygen, the resistively switchable material being an amorphous compound comprising carbon and oxygen, the C:O stoichiometric ratio ranging between 1:0.30 to 1:0.80.

2. The resistive memory element according to claim 1, wherein a ratio of C—C sp2 bonds to C—C sp3 bonds in the resistively switchable material in its pristine state is less than 0.4.

3. The resistive memory element according to claim 2, wherein the resistively switchable material is doped with one or more of the following elements: Si, H and N.

4. The resistive memory element according to claim 1, wherein a first one of the two conductive electrodes comprises a first material in contact with the resistively switchable material, the second one of the two electrodes comprises a second material in contact with the resistively switchable material, and wherein the first material and the second material have different oxidation potentials, and wherein the first material and the second material are: W and Pt, graphite or graphene and Pt, graphite or graphene and W, or W and Al, respectively.

5. The resistive memory element according to claim 1, wherein an average thickness of the resistively switchable material is between 2 and 30 nm.

6. The resistive memory element according to claim 1, wherein the resistively switchable material, and the two conductive electrodes have a layered structure, the resistively switchable material being in a layer sandwiched between two electrode layers forming respectively the two conductive electrodes.

7. The resistive memory element according to claim 6, further comprising:
an insulating layer, comprising $SiO_2$, patterned onto one of the electrodes such as to define a cavity, the cavity filled with the resistively switchable material, and wherein the layer of resistively switchable material is conformal with the insulating layer, the other one of the two electrode layers being conformal with the layer of resistively switchable material.

8. The resistive memory element according to claim 1, wherein the resistive memory element comprises one or more memory elements.

9. A method for storing information in a resistive memory element, the method comprising:
applying an electric signal between the two conductive electrodes of the resistive memory element, to change the resistance state of the memory element, the resistive memory element of resistively switchable material that is an amorphous compound comprising carbon and oxygen, the C:O stoichiometric ratio ranging between 1:0.30 to 1:0.80.

10. The method according to claim 9, further comprising:
prior to obtaining the resistively switchable material, providing a substrate; and
depositing a bottom electrode, wherein, the resistively switchable material comprises a deposit of said amorphous compound, and wherein, the deposited amorphous is sputtered, such that a region of said amorphous compound is in contact with said bottom electrode, and wherein, the resistively switchable material is deposited at a top electrode.

11. The method according to claim 10, wherein the method further comprises, prior to obtaining the resistively switchable material, and after depositing the bottom electrode, a step of patterning an insulating layer, wherein the insulation includes a $SiO_2$, onto the bottom electrode, and wherein the $SiO_2$ is insulted to define a cavity, and wherein, the cavity is filled with the resistively switchable material when depositing said amorphous compound.

12. The method according to claim 11, wherein said amorphous compound is obtained by reactive sputtering.

13. The method according to claim 12, wherein obtaining said amorphous compound comprises:
introducing a substrate comprising a conductive electrode in a sputtering chamber that comprises a graphite target;
introducing in said chamber, a mixture of $O_2$ gas and an inert gas such as Ar; and
activating a plasma state of the mixture to bombard the graphite target, wherein an oxygenated amorphous carbon deposits on the conductive electrode.

* * * * *